(12) United States Patent
Hamaguchi

(10) Patent No.: US 9,721,910 B2
(45) Date of Patent: Aug. 1, 2017

(54) METHOD FOR MANUFACTURING SEMICONDUCTOR DEVICE, SEMICONDUCTOR MANUFACTURING APPARATUS, AND WAFER LIFT PIN-HOLE CLEANING JIG

(71) Applicant: Renesas Electronics Corporation, Koutou-ku, Tokyo (JP)

(72) Inventor: Yohei Hamaguchi, Ibaraki (JP)

(73) Assignee: Renesas Electronics Corporation, Koutou-Ku, Tokyo (JP)

( * ) Notice: Subject to any disclaimer, the term of this patent is extended or adjusted under 35 U.S.C. 154(b) by 0 days.

(21) Appl. No.: 15/200,131

(22) Filed: Jul. 1, 2016

(65) Prior Publication Data
US 2017/0018515 A1   Jan. 19, 2017

(30) Foreign Application Priority Data
Jul. 15, 2015   (JP) .................................. 2015-141229

(51) Int. Cl.
C23C 16/44 (2006.01)
H01L 23/00 (2006.01)
H01L 21/687 (2006.01)
H01J 37/32 (2006.01)

(52) U.S. Cl.
CPC .......... *H01L 24/03* (2013.01); *C23C 16/4405* (2013.01); *H01J 37/3211* (2013.01); *H01J 37/3288* (2013.01); *H01J 37/32715* (2013.01); *H01J 37/32733* (2013.01); *H01J 37/32862* (2013.01); *H01J 37/32908* (2013.01); *H01L 21/68742* (2013.01); *H01L 24/05* (2013.01); *H01L 2224/03614* (2013.01); *H01L 2224/03622* (2013.01); *H01L 2224/05025* (2013.01); *H01L 2224/05124* (2013.01)

(58) Field of Classification Search
USPC .............. 156/345.47; 118/715, 723; 438/612
See application file for complete search history.

(56) References Cited

U.S. PATENT DOCUMENTS

| 5,215,619 | A  | * | 6/1993  | Cheng .............. H01J 37/32477 118/724 |
| 6,198,074 | B1 | * | 3/2001  | Savas ...................... C23C 16/46 118/725 |
| 6,354,241 | B1 | * | 3/2002  | Tanaka ................... B01D 49/00 118/715 |
| 6,861,321 | B2 | * | 3/2005  | Keeton ............. H01L 21/67109 118/724 |
| 6,964,928 | B2 | * | 11/2005 | Ying ...................... B82Y 25/00 134/1.1 |
| 7,022,436 | B2 | * | 4/2006  | Cummings ............... G03F 1/32 430/5 |
| 7,651,586 | B2 | * | 1/2010  | Moriya ............... C23C 16/4401 118/723 E |

(Continued)

FOREIGN PATENT DOCUMENTS

JP   11-137577 A   5/1999

*Primary Examiner* — Zandra Smith
*Assistant Examiner* — Lawrence Tynes, Jr.
(74) *Attorney, Agent, or Firm* — Sughrue Mion, PLLC

(57) ABSTRACT

To shorten a maintenance time of a semiconductor manufacturing apparatus and to improve productivity of a semiconductor manufacturing line. A semiconductor wafer is processed by the semiconductor manufacturing apparatus in which reaction product in the inside of a wafer lift pin hole was removed using a cleaning jig having a return on its tip part.

14 Claims, 7 Drawing Sheets

(56) References Cited

U.S. PATENT DOCUMENTS

| | | | |
|---|---|---|---|
| 9,393,627 B2* | 7/2016 | Hirasaka | B08B 1/00 |
| 9,563,137 B2* | 2/2017 | Lammers | B08B 5/02 |
| 9,566,616 B2* | 2/2017 | Togawa | H01L 21/67046 |
| 2001/0016364 A1* | 8/2001 | Loan | C23C 16/44 438/14 |
| 2002/0068229 A1* | 6/2002 | Westerman | G03F 1/32 430/5 |
| 2002/0150395 A1* | 10/2002 | Shimizu | C23C 16/481 392/418 |
| 2002/0182892 A1* | 12/2002 | Arai | C23C 16/4583 438/784 |
| 2003/0097987 A1* | 5/2003 | Fukuda | C23C 16/4405 118/723 E |
| 2003/0205326 A1* | 11/2003 | Miya | C23C 16/5096 156/345.24 |
| 2004/0003828 A1* | 1/2004 | Jackson | B08B 7/0021 134/1 |
| 2004/0005211 A1* | 1/2004 | Lowrance | H01L 21/67742 414/744.1 |
| 2004/0071874 A1* | 4/2004 | Shimizu | C23C 16/4409 427/248.1 |
| 2004/0091636 A1* | 5/2004 | Sakamoto | C23C 16/08 427/569 |
| 2004/0255854 A1* | 12/2004 | Sakai | C23C 16/4405 118/715 |
| 2007/0041812 A1* | 2/2007 | Tokuda | H01L 21/67778 414/217 |
| 2007/0160507 A1* | 7/2007 | Satoh | C23C 16/4586 422/135 |
| 2008/0105194 A1* | 5/2008 | Nakao | B08B 7/00 117/97 |
| 2008/0305430 A1* | 12/2008 | Lee | C07C 69/42 430/281.1 |
| 2015/0036259 A1* | 2/2015 | Cox | H01L 21/6833 361/234 |
| 2017/0018515 A1* | 1/2017 | Hamaguchi | H01L 24/03 |

* cited by examiner

Al dry etching

Ashing
(Photoresist film removal)

METHOD FOR MANUFACTURING SEMICONDUCTOR DEVICE, SEMICONDUCTOR MANUFACTURING APPARATUS, AND WAFER LIFT PIN-HOLE CLEANING JIG

CLAIM OF PRIORITY

The present application claims priority from Japanese Patent application serial no. 2015-141229, filed on Jul. 15, 2015, the content of which is hereby incorporated by reference into this application.

BACKGROUND OF THE INVENTION

Field of the Invention

The present invention relates to a method for manufacturing a semiconductor device, and in particular, relates to maintenance of a semiconductor manufacturing apparatus.

Description of the Related Art

The semiconductor manufacturing apparatuses, such as a dry etching apparatus, a CVD apparatus (CVD: Chemical Vapor Deposition), and a sputtering apparatus, that are used in a semiconductor manufacturing line each have a processing chamber in which a semiconductor wafer is processed in vacuum, and each mount a semiconductor wafer on a stage (a lower part electrode) in the processing chamber, where various processing such as dry etching by plasma is performed.

A through hole that penetrates from the front side to the back side is provided in the stage in the processing chamber and the processing chamber has a structure in which a semiconductor wafer is delivered between the wafer conveying arm and the stage by a wafer lift pin moving up and down in the inside of the through hole.

In these semiconductor manufacturing apparatuses, when processing a semiconductor wafer inside the processing chamber, reaction product is generated, and the reaction product adheres to the inside of the through hole (lift pin hole) of the stage through which the wafer lift pin moves up and down and also to a support part (lift pin gripper) of the wafer lift pin.

When deposition of the reaction product inside the lift pin hole increases, there is a possibility that the lift pin may be caught by the reaction product and the lift pin may escape from a lift pin supporting part. Moreover, when an amount of deposition of the reaction product onto the lift pin supporting part increases, slidability of the lift pin supporting part gets worse, and there is a concern about lift pin omission similarly.

Then, cleaning that removes periodically the reaction product adhering to the inside of the lift pin hole and the lift pin supporting part becomes required, but in order to clean these portions, the stage (lower electrode) must be decomposed, which needs much labor and apparatus halt time for the cleaning.

As a method for removing the reaction product inside the lift pin hole without disassembling a stage (lower electrode), a method that uses a cleaning tool like that of Patent Document 1 is considered, for example. Patent Document 1 is related to an interdental toothbrush for removing dirt between teeth of a human body.

[Patent document 1] Japanese Patent Application Laid-Open No. Hei 11(1999)-137577

When a cleaning tool of Patent Document 1 described above is tried to be used for cleaning the lift pin hole of a semiconductor manufacturing apparatus, since the cleaning tool does not have sufficient strength for removing reaction product inside the lift pin hole, it is difficult to remove the reaction product effectively. Moreover, it is also difficult to prevent the removed reaction product from falling to the lower part of the lift pin hole. Furthermore, the cleaning tool of Patent Document 1 is used as an interdental brush originally, and if it is used in cleaning of the semiconductor manufacturing apparatus, there will be a possibility of becoming a cause of contamination.

Other problems and new features will become clear from description and accompanying drawings of this specification.

SUMMARY OF THE INVENTION

According to one embodiment, a semiconductor wafer is processed by the semiconductor manufacturing apparatus in which the reaction product inside a wafer lift pin hole is removed using a cleaning jig that has a return in its tip part.

Moreover, according to another embodiment, the semiconductor manufacturing apparatus is a semiconductor manufacturing apparatus that has a cleaning function of removing the reaction product adhering to a hole part in a processing chamber.

Moreover, according to further another embodiment, the cleaning jig is a cleaning jig for removing the reaction product adhering to the hole part of the processing chamber of the semiconductor manufacturing apparatus.

According to the one embodiment, it is possible to shorten a maintenance time of the semiconductor manufacturing apparatus, whereby productivity of a semiconductor manufacturing line improves.

DETAILED DESCRIPTION OF THE PREFERRED EMBODIMENTS

Figure 1A:
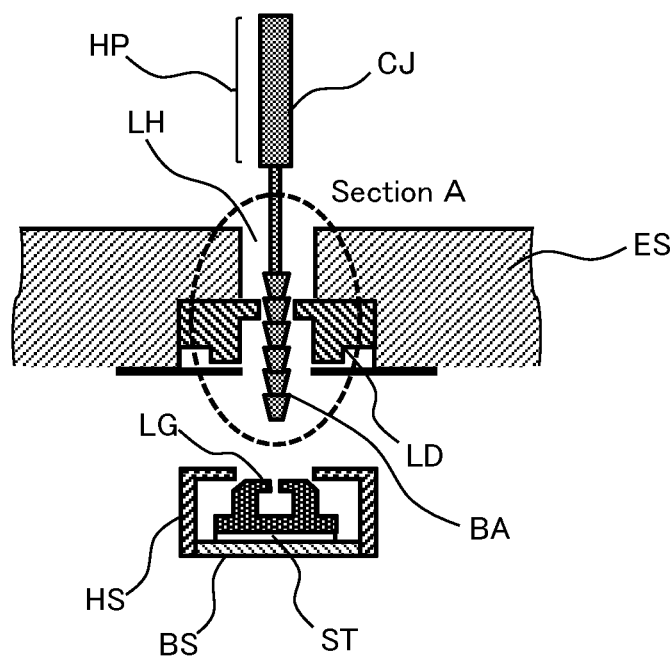
FIG. 1A is a partial sectional view of a semiconductor manufacturing apparatus and a cleaning jig according to one embodiment of the present invention.

Hereinafter, examples are described using drawings. Incidentally, the same reference numeral is attached to the same configuration in each drawing, and a detailed explanation is omitted for an overlapping portion.

First Example

Figure 8:
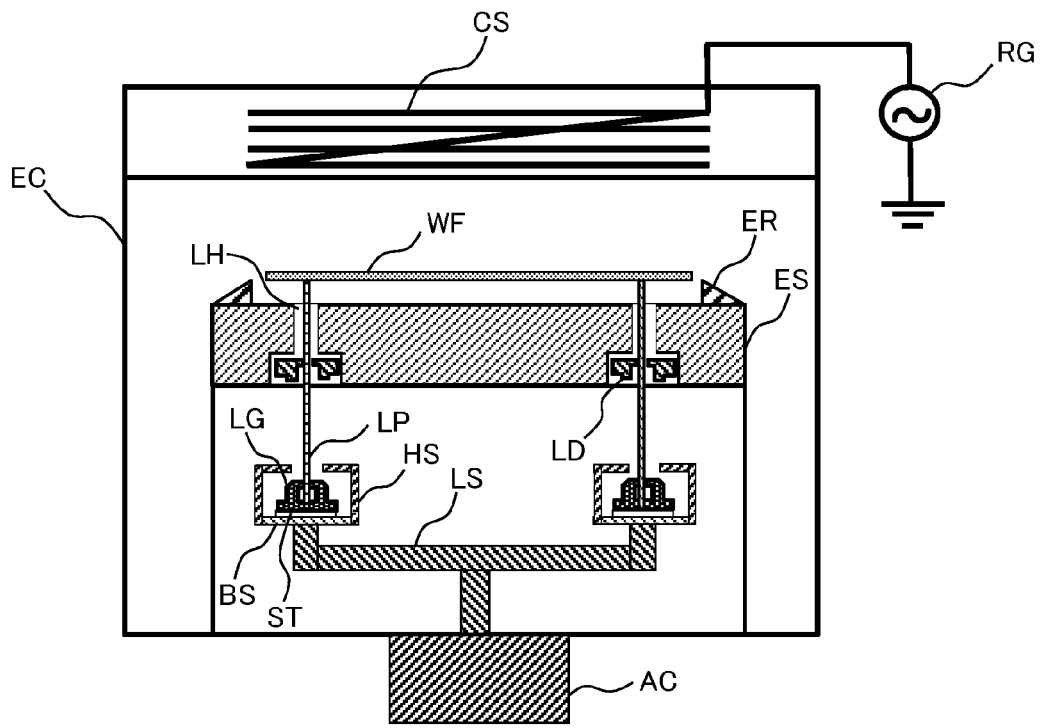
FIG. 8 is a sectional view of a processing chamber of the semiconductor manufacturing apparatus according to the one embodiment of the present invention.
Figure 9:
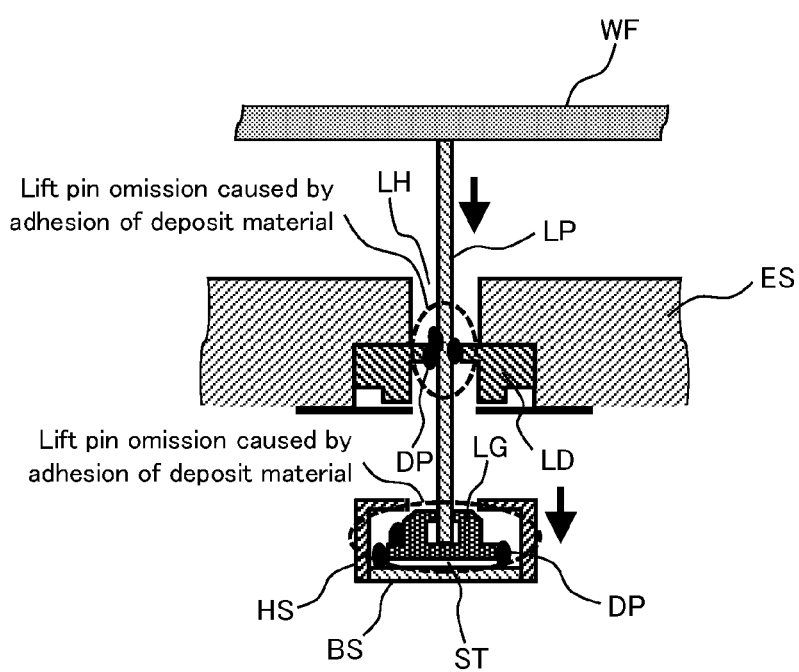
FIG. 9 is a diagram showing a problem around a lift pin of the semiconductor manufacturing apparatus.

First, a configuration of a processing chamber of a semiconductor manufacturing apparatus of this example and a problem around the lift pin are explained using FIG. 8 and FIG. 9. FIG. 8 shows an example of a dry etching apparatus including a coil inductively coupled plasma source. Moreover, FIG. 9 is an enlarged view of a lift pin LP and an area around a lift pin guide LD of FIG. 8.

As shown in FIG. 8, the dry etching apparatus of this example includes a coil source CS acting as a plasma source on the upper part of an etching chamber EC. A high-frequency power is supplied to the coil source CS from an RF generator RG.

The etching chamber EC is provided with a vacuum pumping system and a gas supply system that are not illustrated. After the etching chamber EC is vacuum evacuated, plasma is generated in the etching chamber EC by introducing a process gas into the etching chamber EC and applying a high-frequency power to the coil source CS.

In the etching chamber EC, an electrostatic chuck ES (ESC: Electrostatic Chuck) for mounting and retaining a semiconductor wafer WF that is a target of dry etching processing is provided. This electrostatic chuck ES is also called a stage or a lower electrode because of its function to which an attention is paid. Moreover, for the electrostatic chuck ES, a base material of aluminum (Al) coated with ceramic containing a dielectric and the like are used.

The electrostatic chuck ES has a structure in which a through hole penetrating from the front surface to the back surface is provided and the lift pin LP is driven up and down inside the through hole. This through hole is a lift pin hole LH.

Under the electrostatic chuck ES, a retention mechanism for supporting the lift pin LP is provided. This retention mechanism is configured with a lift pin gripper LG for holding one end of the lift pin LP, a housing HS for covering and protecting a holding part of the lift pin LP, a base BS and a stem ST that support the lift pin gripper LG, etc. Incidentally, the lift pin gripper LG is formed, for example, of a heat resistant plastic like a polyimide resin. Moreover, the housing HS and the base BS are formed of stainless steel (SUS), and the stem ST is formed of a fluorocarbon resin, for example, respectively.

The lift pin gripper LG is supported by a support arm called a lift pin spider LS through the stem ST and the base BS, and is driven up and down by an air cylinder AC.

The lift pin LP is disposed penetrating the lift pin hole LH, and the lift pin guide LD is provided between the lift pin LP and the lift pin hole LH so that the lift pin LP may be driven up and down as perpendicularly as possible. The lift pin LP is formed of, for example, sapphire whose raw material is high-purity alumina ($Al_2O_3$). Moreover, the lift pin guide LD is formed of a heat-resistant plastic such as a polyimide resin.

After conveying the semiconductor wafer WF into the etching chamber EC by an unillustrated wafer conveying arm, the lift pin LP rises and receives the semiconductor wafer WF from the wafer conveying arm. After the wafer conveying arm moves from the etching chamber EC, the lift pin LP that received the semiconductor wafer WF descends, and the semiconductor wafer WF is mounted on a surface of the electrostatic chuck ES. Incidentally, in order to prevent offset of the semiconductor wafer WF when the semiconductor wafer WF is mounted on the electrostatic chuck ES, an edge ring ER (wafer holding ring) formed of quartz, silicon, ceramics, or the like is disposed around the electrostatic chuck ES.

Here, as described above, in the semiconductor manufacturing apparatuses, such as the dry etching apparatus, a CVD apparatus, and a sputtering apparatus, lift pin omission caused by reaction product deposited in the inside of the lift pin hole LH and around the lift pin gripper LG that is a support part of the lift pin LP becomes a problem.

As shown in FIG. 9, when adhesion of the reaction product (deposited material) DP increases between the lift pin guide LD and the lift pin LP and around the lift pin gripper LG, there may occur catch with the reaction product (deposited material) DP when the lift pin LP is being driven up and down, which may worsen slidability of the lift pin LP, in some cases resulting in lift pin omission where the lift pin LP escapes from the lift pin gripper LG.

In addition to the problem shown in FIG. 9, when a portion of reaction product DP deposited in the lift pin hole LH peels off and adheres to the surface of the electrostatic chuck ES as a foreign substance, it may become a cause of device trouble such as an electrostatic attraction error of the semiconductor wafer WF, or a cause of a product defect because of abnormal discharge occurring between the surface of the electrostatic chuck ES and the back surface of the semiconductor wafer WF.

Then, if cleaning for removing the reaction product DP in the inside of the lift pin hole LH and around the lift pin gripper LG is tried to be performed, it is necessary to decompose the electrostatic chuck ES (lower electrode), which requires much labor and apparatus halt time in order to perform the cleaning.

Therefore, how effectively the reaction product DP deposited in the inside of the lift pin hole LH and around the lift pin gripper LG can be discharged (removed) to the outside of the etching chamber EC has become an important problem for improving productivity of each semiconductor manufacturing apparatus and, therefore, productivity of a semiconductor manufacturing line.

Figure 1B:
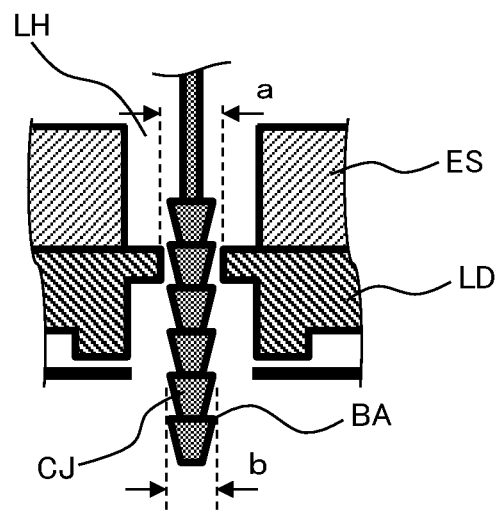
FIG. 1B is an enlarged view of a section A of FIG. 1A.

Next, a wafer lift pin-hole cleaning jig in this example is explained using FIG. 1A and FIG. 1B. FIG. 1A shows a state where a cleaning jig CJ is inserted into the lift pin hole LH after the lift pin is pull out of the lift pin gripper LG. FIG. 1B is an enlarged view of a section A of FIG. 1A.

The cleaning jig CJ in this example is formed to rod shape so as to be able to be inserted into the lift pin hole LH as shown in FIG. 1A. A holding part HP is formed on one end of the cleaning jig CJ so that a worker can hold it at the time of cleaning. Moreover, at least one or more returns BA are provided in a tip part (other end) of the cleaning jig CJ. FIG. 1A shows an example of the cleaning jig with six returns BA provided thereon.

By providing the returns on the tip part of the cleaning jig CJ, in the case of periodic maintenance of the etching chamber EC, it is possible to insert the cleaning jig CJ after drawing out the lift pin LP from an upper surface side of an electrostatic chuck EC and to effectively scrape out (rake out) the reaction product deposited in the inside of the lift pin hole by the return BA to the outside of the lift pin hole.

Incidentally, as shown in FIG. 1B, a width (thickness) b of the return BA of the cleaning jig CJ is formed to be narrower (thinner) than a width a of a portion of the lift pin guide LD that has the narrowest width in the lift pin hole LH so that the cleaning jig CJ can be inserted into the lift pin hole LH. That is, it has a relation of b<a. However, since when the size of the width b is too narrow compared with the width a, the reaction product inside the lift pin hole LH cannot be scraped out sufficiently, it is preferable that the width (thickness) b of the return BA is as close to the width a of the portion of the lift pin guide LD as possible.

For example, when the width a of the portion of the lift pin guide LD is about 1.6 mm, the width (thickness) b of the return BA is formed in about 1.5 mm.

In common semiconductor manufacturing apparatuses, since the thickness of the lift pin LP is the extent from $\phi 1.0$ mm to 2.0 mm, a diameter of the lift pin hole LH (in this example, the width a of the portion of the lift pin guide LD) becomes the extent from $\phi 1.2$ mm to 2.2 mm. Therefore, it becomes a standard to form the return BA of the cleaning jig CJ to have a diameter in the extent from $\phi 1.1$ mm to 2.1 mm. However, numerical values shown here are merely illustrations, and the examples are not limited to these.

Moreover, as for the material of the cleaning jig CJ, it is preferable to use what has sufficient strength, such as stainless steel (SUS), aluminum (Al), and a resin, so that the reaction product in the lift pin hole LH can be scraped out effectively.

Furthermore, as for the material of the cleaning jig CJ, it is more preferable to use a material difficult to be electrified in order to prevent the reaction product that was scraped out with the cleaning jig CJ from adhering again to the lift pin guide LD and the inside of the lift pin holes LH due to static electricity. It is recommendable to form at least the tip part on which the return is provided of a material difficult to be electrified.

As explained above, by using the cleaning jig CJ shown in FIG. 1A and FIG. 1B for cleaning of the lift pin hole of the semiconductor manufacturing apparatus, the reaction product that deposited in the lift pin hole LH can be scraped out to the outside of the lift pin hole LH without making it fall downward, and it is possible to perform the cleaning of the inside of the lift pin hole LH effectively.

Moreover, since the reaction product deposited in the lift pin hole LH can be removed without decomposing electrostatic chuck EC (lower electrode), it is possible to shorten the apparatus halt time considerably and to improve the productivity of the semiconductor manufacturing apparatus dramatically.

Figure 2A:
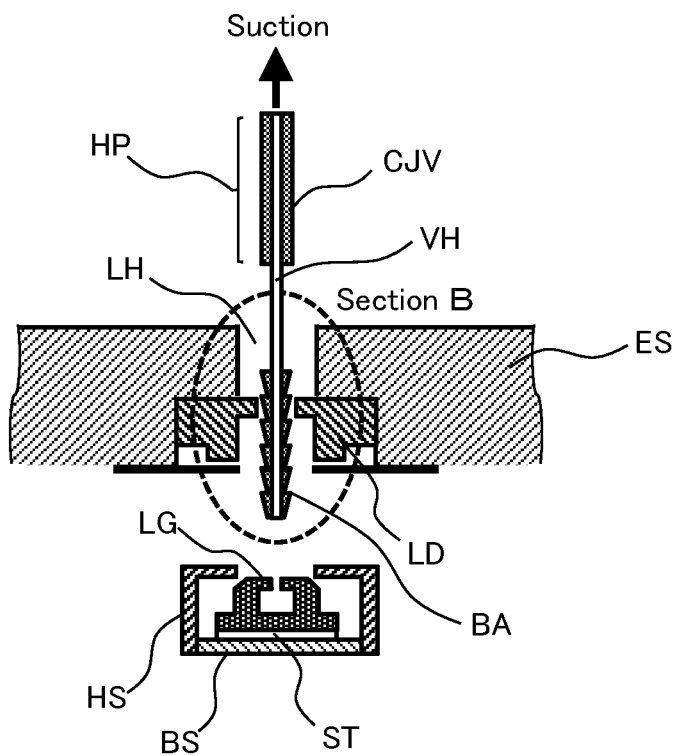
FIG. 2A is a partial sectional view of the semiconductor manufacturing apparatus and the cleaning jig according to the one embodiment of the present invention.
Figure 2B:
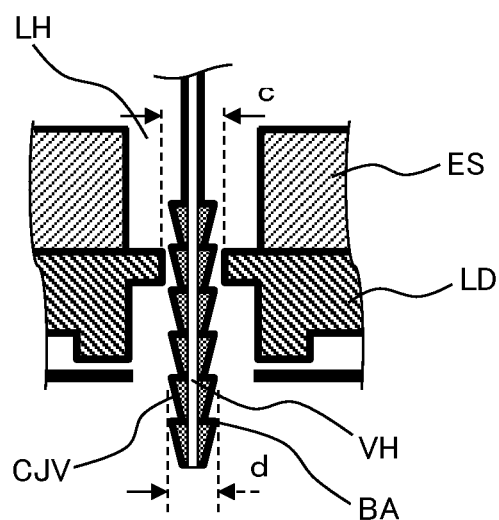
FIG. 2B is an enlarged view of a section B of FIG. 2A.

A modification of the cleaning jig CJ is explained using FIG. 2A and FIG. 2B. Incidentally, FIG. 2B is an enlarged view of a section B of FIG. 2A.

A cleaning jig CJV with a suction hole shown in FIG. 2A and FIG. 2B differs from the cleaning jig CJ shown in FIG. 1A and FIG. 1B in a point that it has a through hole that penetrates from one end to the other end. This through hole functions as a suction hole VH when the scraped-out reaction product is sucked from the tip part of the cleaning jig, and is discharged to the outside.

Incidentally, a relation of the width (thickness) d of the return BA and a width c of a portion of the lift pin guide LD that are shown in FIG. 2B becomes such that d<c. Since this relation of c and d is the same as the relation of a and b in FIG. 1B, its detailed explanation is omitted.

Figure 3:
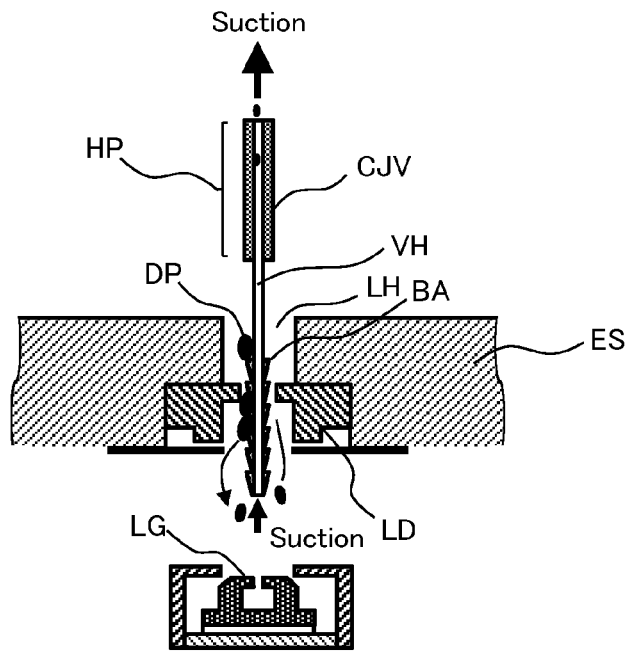
FIG. 3 is a partial sectional view of the semiconductor manufacturing apparatus and the cleaning jig according to the one embodiment of the present invention.

An action of the cleaning jig CJV with a suction hole is explained in more detail using FIG. 3. In FIG. 1A and FIG. 1B, when the cleaning jig CJ is inserted into the lift pin hole LH, the reaction product deposited around the lift pin guide LD is pared away by the return BA, and a portion of it falls downward. Then, fall of the reaction product DP can be prevented by providing the through hole that penetrates from the tip part of the cleaning jig to the other tip part thereof, sucking the reaction product DP being scraped out when the lift pin hole LH is inserted from its tip part, and discharging it to the outside, like the cleaning jig CJV with a suction hole of FIG. 2A and FIG. 2B Moreover, when the reaction product DP in the lift pin hole LH is scraped out with the return BA by making the cleaning jig CJV with a suction hole move up and down in the lift pin hole LH, the scraped-out reaction product DP can be sucked without dropping it from the tip part.

Furthermore, the reaction product that failed to be sucked and fell around the lift pin gripper LG can also be sucked up by the cleaning jig CJV with a suction hole, and can be discharged to the outside.

Figure 4:
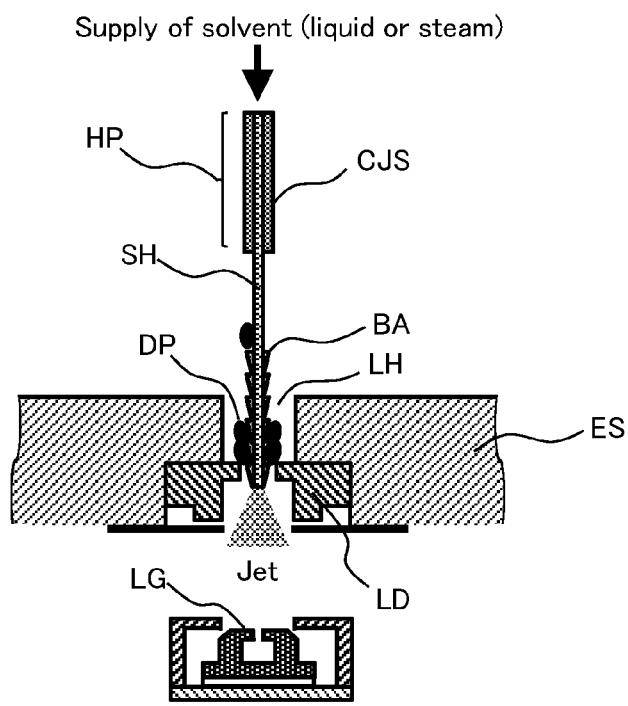
FIG. 4 is a partial sectional view of the semiconductor manufacturing apparatus and the cleaning jig according to the one embodiment of the present invention.

Another modification of the cleaning jig CJ is explained using FIG. 4. The cleaning jig CJS with a solvent supply hole shown in FIG. 4 has a through hole that penetrates from one end to the other end like the cleaning jig CJV with a suction hole of FIG. 3. This through hole supplies a solvent such as methanol from its one end, and functions as a solvent supply hole SH at the time of jetting the solvent into the lift pin hole LH from the other end (tip part).

By the solvent being jetted from the tip part of the cleaning jig CJS with a solvent supply hole into the lift pin hole LH, the reaction product DP can be dissolved and removed in a short time, and thereby the apparatus halt time can further be shortened.

Incidentally, the solvent to be supplied is not limited to methanol, and should just be a solvent that can dissolve and remove the reaction product. Since a component of the reaction product is different with a kind of process that is the target of cleaning of the semiconductor manufacturing apparatus, a kind of the solvent is suitably selected and used according to the kind of process of the semiconductor manufacturing apparatus.

Moreover, more effective cleaning can be attained by suitably selecting either jetting the solvent as it is in a liquid state or jetting it in a vaporous state after heating according to the kind of the solvent to be supplied and the component of the reaction product.

Second Example

Figure 5A:
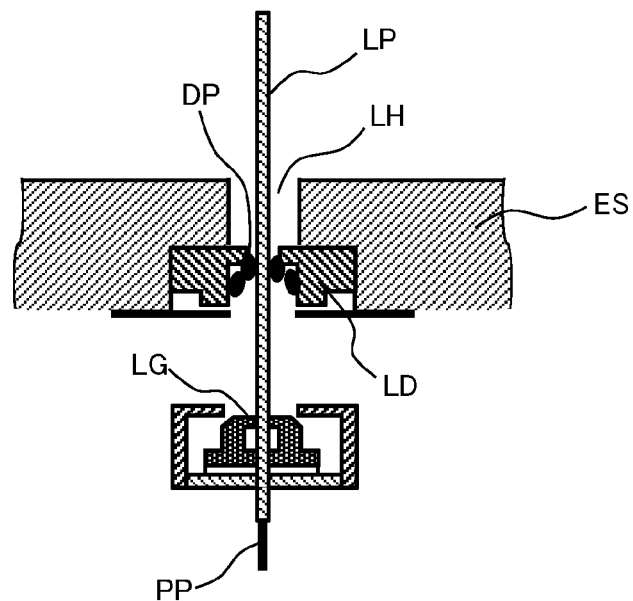
FIG. 5A is a partial sectional view of the semiconductor manufacturing apparatus according to one embodiment of the present invention.
Figure 5B:
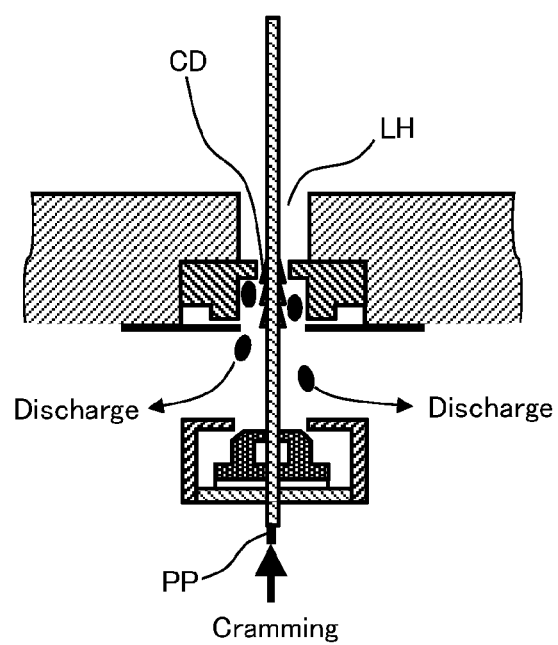
FIG. 5B is a partial sectional view of the semiconductor manufacturing apparatus according to the one embodiment of the present invention.

The semiconductor manufacturing apparatus in this example is explained using FIG. 5A and FIG. 5B. The semiconductor manufacturing apparatus of this example is a semiconductor manufacturing apparatus that includes a cleaning mechanism of the lift pin hole LH. FIG. 5A shows a state of surroundings of the lift pin LP under operation, and FIG. 5B shows a state at the time of cleaning of the lift pin hole LH.

As shown in FIG. 5A, a cramming part PP is provided in the lower part of the lift pin LP of the semiconductor manufacturing apparatus of this example. As shown in FIG. 5B, a cleaning mechanism CD is made to operate by cramming this cramming part PP to scrape out the reaction product DP deposited in the lift pin hole LH.

The cleaning mechanism CD has a structure in which the return BA of the cleaning jig CJ explained in the first example is embedded in the inside of the lift pin LP, and when cleaning the lift pin hole LH, the return protrudes to the outside of the lift pin LP by cramming the cramming part PP of the lower part of the lift pin LP, and scrapes out the reaction product deposited in the lift pin hole LH. The scraped-out reaction product falls and is discharged to the outside by evacuation of the apparatus.

Incidentally, the scraped-out reaction product can be discharged to the outside of the apparatus more efficiently by using together cycle purging where evacuation of the etching chamber and introduction of the gas are repeated by turns. For the gas used for the cycle purging, the process gas used for process treatment of the semiconductor manufacturing apparatus and inert gases, such as nitrogen gas ($N_2$), argon gas (Ar), and helium gas (He) are used.

Moreover, when scraping out the reaction product in the lift pin hole LH by the cleaning mechanism CD and the cycle purging are performed simultaneously, the reaction product can be effectively discharged to the outside of the etching chamber by introducing the gas into the etching chamber when the lift pin LP descends and evacuating the atmosphere of the etching chamber when the lift pin LP rises.

As explained above, according to the semiconductor manufacturing apparatus of this example, since the lift pin hole LH can be cleaned without opening the processing chamber (chamber) in the atmosphere, the apparatus halt time can further be shortened.

Incidentally, although in the example, as an example of the cleaning mechanism, a structure in which the return is made to protrude to the outside of the lift pin LP by cramming the cramming part of the lower part of the lift pin LP as in FIG. 5A and FIG. 5B is shown, the structure of the cleaning mechanism is not limited to this, and a structure in which the return is made to protrude to the outside of the lift pin by another predetermined operation may be adopted.

Third Example

Figure 6:
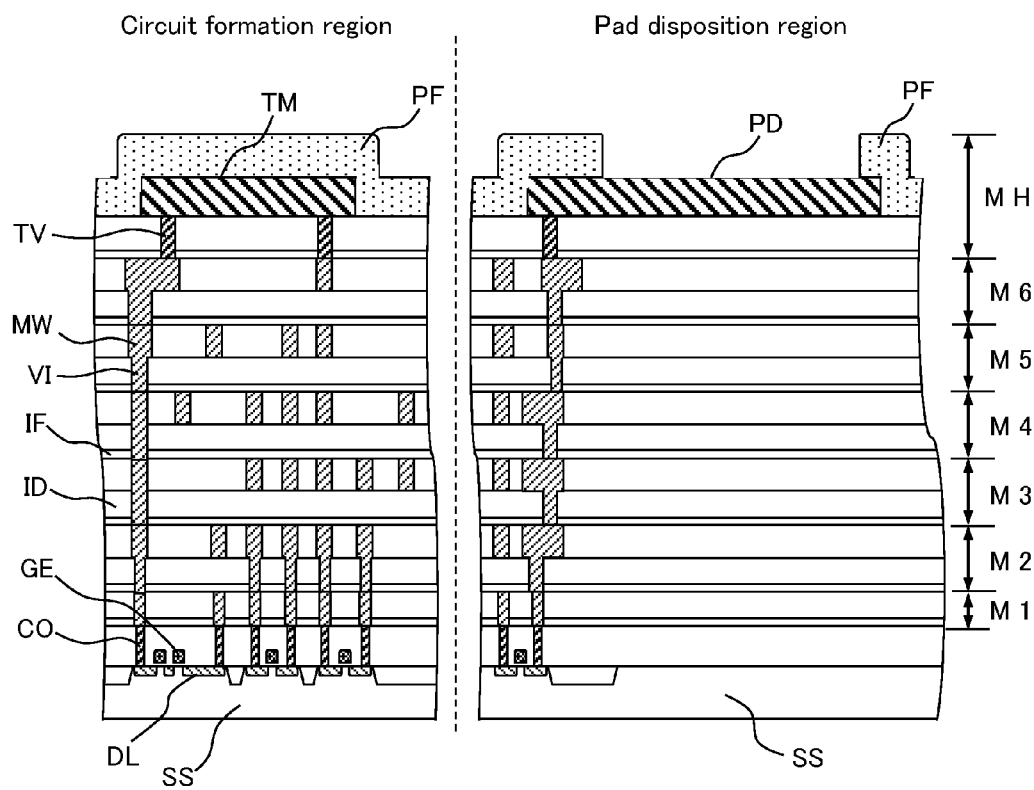
FIG. 6 is a partial sectional view of the semiconductor device according to the one embodiment of the present invention.
Figure 7A:
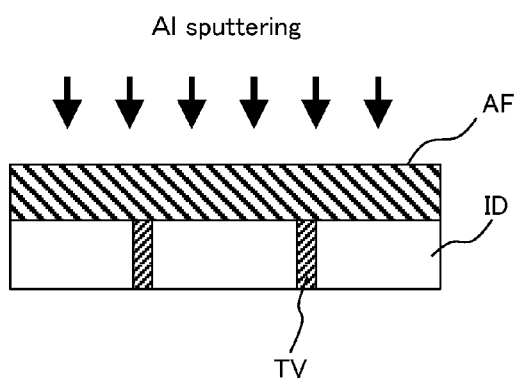
FIG. 7A is sectional view showing a part of a manufacturing process of the semiconductor device according to one embodiment of the present invention.
Figure 7B:
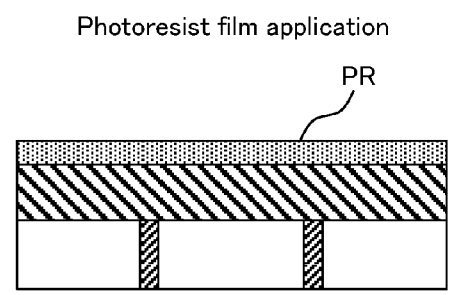
FIG. 7B is sectional view showing a part of the manufacturing process of the semiconductor device according to the one embodiment of the present invention.
Figure 7C:
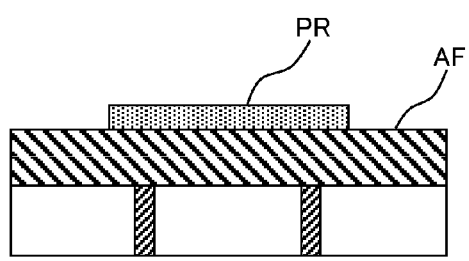
FIG. 7C is sectional view showing a part of the manufacturing process of the semiconductor device according to the one embodiment of the present invention.
Figure 7D:
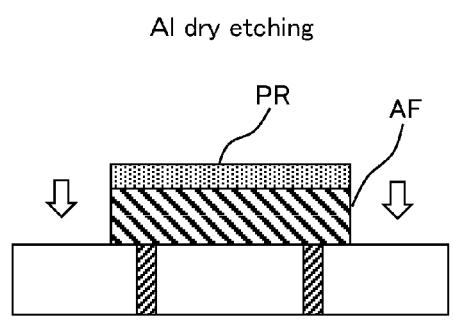
FIG. 7D is a sectional view showing a part of the manufacturing process of the semiconductor device according to the one embodiment of the present invention.
Figure 7E:
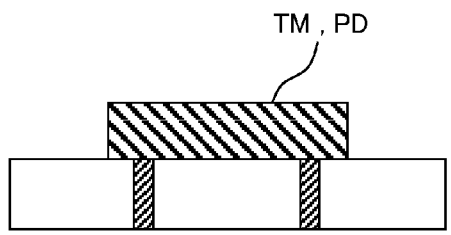
FIG. 7E is a sectional view showing a part of the manufacturing process of the semiconductor device according to the one embodiment of the present invention.

A method for manufacturing a semiconductor device in this example is explained using FIG. 6 to FIG. 7E. FIG. 6 shows a part of a semiconductor device that is manufactured by performing the process treatment using either the semiconductor manufacturing apparatus whose lift pin hole I cleaned by using the cleaning jig explained in the first example, or the semiconductor manufacturing apparatus explained in the second example. The left-hand side of FIG. 6 shows a circuit formation region, and the right-hand side thereof shows a pad disposition region. Moreover, FIG. 7A to FIG. 7E show a formation flow of the top layer wiring TM and the pad electrode PD formed in the wiring layer MH that is the top layer of FIG. 6.

As shown in FIG. 6, in the semiconductor device in this example, various elements, such as a transistor made of having a diffusion layer DL and a gate electrode GE on a principal plane of a semiconductor substrate SS, are formed.

On each of various elements, a first wiring layer M1, a second wiring layer M2, a third wiring layer M3, a fourth wiring layer M4, a fifth wiring layer M5, a sixth wiring layer M6, and a wiring layer MH that is a top layer are formed sequentially from the lower layer. The each wiring layer is formed such that a wiring MW and a via VI are embedded in a lamination film consisting of an interlayer insulation film ID and an insulator film IF. For the first wiring layer M1 to the sixth wiring layer M6, copper (Cu) wiring and copper (Cu) via that are formed by a single damascene process or a dual damascene process are mainly adopted. Moreover, in a layer in which various elements such as a transistor are formed, in order to avoid contamination of the various elements by copper (Cu), contact CO of tungsten (W) is mainly used.

In the wiring layer MH that is the top layer, a top layer wiring TM is formed on a tungsten (W) via TV in the circuit formation region. Moreover, in the pad disposition region, the pad electrode PD is formed on the tungsten (W) via TV. The top layer wiring TM and the pad electrode PD are mainly formed with an aluminum (Al) film. On the top layer wiring TM and the pad electrode PD, a passivation film (protective film) PF, such as a polyimide resin, is formed so as to cover upper surfaces of the top layer wiring TM and the pad electrode PD. Incidentally, a part of the passivation film (protective film) PF on the pad electrode PD is removed and the part of the pad electrode PD is exposed to the surface.

Since a relatively large current flows through these top layer wiring TM and pad electrode PD, they are formed with thick film thicknesses. For example, in the case of a 45 μm-process generation's product, they are in the extent from 1.5 μm to 2.0 μm. These top layer wiring TM and pad electrode PD are subjected to the dry etching processing by the dry etching apparatus after an aluminum (Al) film was formed on the interlayer insulation film ID that was the top layer by a sputtering apparatus, and are processed into the top layer wiring TM and the pad electrode PD. Since the aluminum (Al) film whose film thickness is thick is used for the top layer wiring TM and the pad electrode PD, a time of the dry etching processing becomes long and an amount of the reaction product generated in the etching chamber of the dry etching apparatus also becomes large.

Therefore, the amount of the reaction product deposited in the lift pin hole LH in the etching chamber also becomes large, and the lift pin omission caused by adhesion of the reaction product (deposition material) that was explained in FIG. 9 becomes more likely to occur.

Then, at the time of the periodic maintenance of the dry etching apparatus that is used when the top layer wiring TM and the pad electrode PD are processed, it becomes possible to shorten the halt time of the dry etching apparatus considerably by using the cleaning jig CJ, the cleaning jig CJV with a suction hole, or the cleaning jig CJS with a solvent supply hole that were explained in the first example. Thereby, productivity of the semiconductor manufacturing line improves dramatically.

Moreover, the dry etching apparatus including the lift pin-hole cleaning mechanism explained in the second example can be used for the dry etching processing of an aluminum (Al) film, which can improve the productivity of the semiconductor manufacturing line similarly.

A formation flow of the top layer wiring TM and the pad electrode PD explained above is shown in FIG. 7A to FIG. 7E.

First, an aluminum (Al) film AF is formed on the interlayer insulation film ID that is the top layer in which a tungsten via TV was formed. (FIG. 7A) Next, a photoresist film PR is applied onto the aluminum (Al) film AF by a coater. (FIG. 7B)

Next, a desired circuit pattern (here, a pattern of the top layer wiring TM and the pad electrode PD) is transferred to the photoresist film PR by photolithography, and the photoresist film is subjected to a developing process to form a mask pattern of the photoresist film PR. (FIG. 7C)

Following this, the aluminum (Al) film AF is subjected to the dry etching processing by the dry etching apparatus using the mask pattern of the photoresist film PR as a dry etching mask to remove excessive aluminum (Al) film AF. When a thin film to be etched is an aluminum (Al) film, a mixed gas of chlorine ($Cl_2$)/boron trichloride ($BCl_3$) is mainly used as the process gas for this dry etching processing. (FIG. 7D)

Here, as explained above, the dry etching processing of an aluminum (Al) film thick in film thickness as in the case of the top layer wiring TM or the pad electrode PD takes a long processing time. Accordingly, the dry etching apparatus in which the reaction product inside a wafer lift pin hole was removed using the cleaning jig having a return in the tip part that was explained in the first example is used for the dry etching of this aluminum (Al) film. Alternatively, the dry etching apparatus including the lift pin-hole cleaning mechanism explained in the second example is used.

Finally, the top layer wiring TM and the pad electrode PD are formed by performing an asking treatment with oxygen ($O_2$) plasma, etc. on the mask pattern (photoresist film PR) that remains without being etched. (FIG. 7E)

As explained above, according to the method for manufacturing a semiconductor device of this example, it is possible to shorten the apparatus halt time by the periodic maintenance of the semiconductor manufacturing apparatus that is represented by the dry etching apparatus, and to improve the productivity of the semiconductor manufacturing line dramatically.

Incidentally, in the third example, although the target semiconductor manufacturing apparatus is shown by the example of the dry etching apparatus and the target process is illustrated by the dry etching process of the aluminum (Al) film, the semiconductor manufacturing apparatus and the method for manufacturing a semiconductor device are not limited to these.

A target semiconductor manufacturing apparatus should be any apparatus that uses the similar wafer lift pin structure, and for example, a CVD apparatus, a sputtering apparatus, and the like can become targets. Moreover, regarding the target process, in addition to the dry etching process of the aluminum (Al) film, the method for manufacturing a semiconductor device can acquire the same effect by using the method in the dry etching process of silicon oxide ($SiO_2$ film) and polysilicon film (Poly-Si film) in which much reaction product is generated in the chamber (processing chamber).

In the above, although the invention made by the present inventors was concretely explained based on the embodiments, it is needless to say that the present invention is not limited to the embodiments and can be varied variously without deviating from the scope of the present invention.

REFERENCE SIGNS LIST

EC: Etching chamber,
RG: RF generator,
CS: Coil source,
ES: Electrostatic chuck (ESC),
LP: Lift pin,
HS: Housing,
LG: Lift pin gripper,
BS: Base,
ST: Stem,
LD: Lift pin guide,
LH: Lift pin hole,
LS: Lift pin spider,
AC: Air cylinder,
ER: Edge ring,
WF: Wafer,
DP: Reaction product,
CJ: Cleaning jig,
HP: Holding part,
BA: Return
CJV: Cleaning jig with suction hole,
VH: Suction hole,
CJS: Cleaning jig with solvent supply hole,
SH: Solvent supply hole,
PP: Cramming part,
CD: Cleaning mechanism,
SS: Semiconductor substrate,
DL: Diffusion layer,
GE: Gate electrode,
CO: Contact,
ID: Interlayer insulation film,
IF: Insulator film,
MW: Wiring,
VI: Via,
PF: Passivation film (protective film),
PD: Pad electrode,
TV: Tungsten (W) via,
TM: Wiring on top layer
M1: First wiring layer,
M2: Second wiring layer,
M3: Third wiring layer,
M4: Fourth wiring layer,
M5: Fifth wiring layer,
M6: Sixth wiring layer,
MH: Wiring layer on top layer,
AF: Aluminum (Al) film,
PR: Photoresist film.

What is claimed is:

1. A method for manufacturing a semiconductor device, comprising the steps of:
   a) forming a thin film on a principal plane of a semiconductor wafer;
   b) applying a photoresist film onto the thin film;
   c) forming a mask pattern by transferring a predetermined circuit pattern to the photoresist film by photolithography; and
   d) performing a dry etch process on the semiconductor wafer with a dry etching apparatus that removes a reaction product inside a wafer lift pin hole using a cleaning jig having a return on its tip part.

2. The method for manufacturing a semiconductor device according to claim 1,
   wherein the reaction product is scraped out to the outside of the wafer lift pin hole by the return on the tip part of the cleaning jig.

3. The method for manufacturing a semiconductor device according to claim 2,
   wherein the cleaning jig has a through hole for sucking the reaction product that is scraped out and the reaction product that is scraped out is discharged to the outside of the wafer lift pin hole through the through hole.

4. The method for manufacturing a semiconductor device according to claim 2,
   wherein the cleaning jig has a through hole that supplies a solvent to the tip part of the cleaning jig, the solvent is supplied to the tip part through the through hole, and the reaction product inside the wafer lift pin hole is solved and removed by the solvent being jetted from the tip part.

5. The method for manufacturing a semiconductor device according to claim 1,
wherein the cleaning jig is such that at least the tip part is formed of a material that is difficult to be electrified.

6. The method for manufacturing a semiconductor device according to claim 1,
wherein the thin film is any of an aluminum film, a silicon oxide film, or a polysilicon film.

7. A semiconductor manufacturing apparatus comprising:
a processing chamber that processes a semiconductor wafer;
a stage that mounts the semiconductor wafer in the processing chamber;
a through hole that is provided penetrating a front surface to a back surface of the stage;
a wafer lift pin that is provided penetrating the inside of the through hole and moves the semiconductor wafer up and down; and
a return that is provided inside the wafer lift pin and protrudes to the outside of the wafer lift pin by a predetermined operation.

8. The semiconductor manufacturing apparatus according to claim 7,
wherein the wafer lift pin has a cramming part in a lower part of the wafer lift pin, makes the return protrude to the outside of the wafer lift pin by cramming the cramming part, and removes the reaction product adhering to the inside of the through hole by making the wafer lift pin move up and down.

9. The semiconductor manufacturing apparatus according to claim 8,
wherein when the reaction product adhering to the inside of the through hole is removed by the return, a cycle purge where introduction of an inert gas to the processing chamber and evacuation of the processing chamber are repeated by turns is performed.

10. The semiconductor manufacturing apparatus according to claim 9,
wherein when the wafer lift pin descends, an inert gas is introduced into the processing chamber, and when the wafer lift pin rises, the processing chamber is evacuated.

11. The semiconductor manufacturing apparatus according to claim 7,
wherein the semiconductor manufacturing apparatus is any of a dry etching apparatus, a CVD apparatus, or a sputtering apparatus.

12. A wafer lift pin-hole cleaning jig that has a grip part on one end of the wafer lift pin-hole cleaning jig and has one or more returns on the other end of the wafer lift pin-hole cleaning jig.

13. The wafer lift pin-hole cleaning jig according to claim 12,
wherein the wafer lift pin-hole cleaning jig has a through hole that penetrates from the one end to the other end.

14. The wafer lift pin-hole cleaning jig according to claim 12,
wherein at least a part at which the return is provided is formed of a material that is difficult to be electrified.

* * * * *